(12) United States Patent
Wan et al.

(10) Patent No.: US 6,667,682 B2
(45) Date of Patent: Dec. 23, 2003

(54) SYSTEM AND METHOD FOR USING MAGNETO-RESISTIVE SENSORS AS DUAL PURPOSE SENSORS

(75) Inventors: Hong Wan, Plymouth, MN (US); Lakshman S. Withanawasam, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/035,957

(22) Filed: Dec. 26, 2001

(65) Prior Publication Data

US 2003/0117254 A1 Jun. 26, 2003

(51) Int. Cl.[7] ............................................... H01L 43/00
(52) U.S. Cl. .................... 338/32 R; 338/12; 338/13; 338/14
(58) Field of Search .......................... 338/12, 13, 14, 338/32 R (56) References Cited

U.S. PATENT DOCUMENTS

| | | | | |
|---|---|---|---|---|
| 3,054,978 A | * | 9/1962 | Schmidlin | 338/32 R |
| 3,569,895 A | * | 3/1971 | Fujisada | 338/32 R |
| 3,949,346 A | * | 4/1976 | Makino et al. | 338/32 R |
| 4,176,305 A | * | 11/1979 | Cuno | 318/653 |
| 4,506,220 A | * | 3/1985 | Sawada et al. | 324/252 |
| 4,847,584 A | | 7/1989 | Pant | 338/32 |
| 4,949,039 A | | 8/1990 | Grunberg | 324/252 |
| 5,247,278 A | | 9/1993 | Pant et al. | 338/32 |
| 5,351,003 A | | 9/1994 | Bauer et al. | 324/207.12 |
| 5,432,734 A | | 7/1995 | Kawano et al. | 365/158 |
| 5,508,867 A | | 4/1996 | Cain et al. | 360/113 |
| 5,561,368 A | | 10/1996 | Dovek et al. | 324/252 |
| 5,589,768 A | * | 12/1996 | Ishiyama et al. | 324/207.21 |
| 5,621,320 A | * | 4/1997 | Yokotani et al. | 324/252 |
| 5,644,456 A | | 7/1997 | Smith et al. | 360/113 |
| 5,742,162 A | | 4/1998 | Nepela et al. | 324/252 |
| 5,820,924 A | | 10/1998 | Witcraft et al. | 427/130 |
| 5,869,963 A | | 2/1999 | Saito et al. | 324/252 |
| 5,945,825 A | * | 8/1999 | Clemens | 324/252 |
| 5,952,825 A | * | 9/1999 | Wan | 324/252 |
| 5,999,378 A | | 12/1999 | Saito et al. | 360/113 |
| 6,061,211 A | | 5/2000 | Yoda et al. | 360/113 |
| 6,153,062 A | | 11/2000 | Saito et al. | 204/192.2 |
| 6,175,296 B1 | * | 1/2001 | Tokunaga et al. | 338/32 R |
| 6,243,288 B1 | | 6/2001 | Ishikawa et al. | 365/158 |
| 6,262,574 B1 | | 7/2001 | Cho et al. | 324/244.1 |
| 6,282,068 B1 | | 8/2001 | Pinarbasi | 360/324.11 |
| 6,313,973 B1 | | 11/2001 | Fuke et al. | 360/324.1 |

FOREIGN PATENT DOCUMENTS

| | | | | |
|---|---|---|---|---|
| DE | 3131431 A | 2/1983 | | G01B/7/02 |
| DE | 19810369 C | 8/1999 | | G01B/7/02 |
| GB | 2251948 A | 7/1992 | | G01D/3/04 |

* cited by examiner

*Primary Examiner*—Karl D. Easthom
(74) *Attorney, Agent, or Firm*—McDonnell Boehnen Hulbert & Berghoff (57) ABSTRACT

An integrated dual-purpose sensor is shown. The dual-purpose sensor in one embodiment of the present invention includes a full Wheatstone bridge or a half Wheatstone bridge providing two output measurements. Specifically, the Wheatstone bridge provides two output measurements that are utilized to determine a temperature sensor reading and a magnetic sensor reading.

6 Claims, 9 Drawing Sheets

SYSTEM AND METHOD FOR USING MAGNETO-RESISTIVE SENSORS AS DUAL PURPOSE SENSORS

FIELD OF THE INVENTION

The present invention relates in general to magnetic field sensors. More specifically, the present invention relates to using magneto-resistive sensors as multi-purpose sensors.

BACKGROUND

There are many applications in which there is a need to measure a magnetic field. Among such applications are magnetic compassing, traffic detection, navigation systems, as well as medical, laboratory and electronic instruments, for instance.

Such applications frequently employ magnetoresistive ("MR") sensors capable of sensing small magnetic fields and their perturbations. Magnetoresistive sensors are often formed using integrated circuit fabrication techniques and are composed of a nickel-iron (permalloy) thin film deposited on a silicon wafer, or other types of substrate, and patterned as resistive strips. When a current is applied to a magnetoresistive sensor, the resistance of the strip depends on the angle between the magnetization and the direction of the applied current, and is maximized when the magnetization and the applied current are parallel. If the permalloy film is subjected to an external magnetic field, the field influences the magnetization, rotating it and thereby changing the film's resistance. Typically, the maximum change in resistance due to rotation of the magnetic field is two to three percent of the nominal resistance.

During manufacture, the easy axis (a preferred direction of magnetization) is set to one direction along the length of the film to allow the maximum change in resistance for an applied field within the permalloy film. However, the influence of a strong magnetic field along the easy axis could rotate the polarity of the film's magnetization, thus, changing the sensor's characteristics. Following such changes, a strong restoring magnetic field is typically applied to restore, or set, the sensor's characteristics. In certain designs, large external magnets can be placed to reset the sensor's settings. However, such an implementation may not be feasible when a magnetoresistive sensor has already been packaged into a system. Particularly, some applications require several sensors within a single package to be magnetized in opposite directions. In such applications, instead of using large external magnets, individual coils may be wrapped around each sensor to reset sensor's characteristics. Alternatively, current straps, also known as set-reset straps and offset straps, may be used to restore the sensor's characteristics. The use of current straps in a magnetic field sensing device is discussed in the U.S. Pat. No. 5,247,278 to Bharat B. Pant, assigned to the same assignee as the current application. U.S. Pat. No. 5,247,278 is fully incorporated herein by reference.

In addition to magnetoresistive sensors, giant magnetoresistive ("GMR") sensors are often used in many applications that require measurements of a relatively small magnetic field. Unlike magnetoresistive sensors, GMR sensors are composed of a multi-layer film deposited on a substrate, and the magnetoresistance occurs as a result of a relative magnetization angle between two adjacent layers, and the current direction typically does not play any role. Thin-film GMR materials deposited on a silicon substrate, or any other substrate, can be configured as resistors, resistor pairs, half bridges or Wheatstone bridges. Unlike magnetoresistive sensors, GMR sensors often do not employ set-reset straps in their configurations.

Many electronic components, such as semiconductor devices or Liquid Crystal Displays ("LCD"), as well as consumer and recreation products such as a compass or global positioning system ("GPS") products, can be damaged by exposure to high or low temperatures. Thus, when temperature limits are exceeded, such components have to be protected from breakdown or malfunction. In systems including temperature sensitive components, temperature sensors play a key role in maintaining the reliability of the system's components.

A number of temperature sensing techniques are currently used, and the most commonly used temperature sensors include resistive temperature detectors ("RTDs"), thermocouples, and sensor integrated circuits ("ICs"). Resistive temperature sensors employ a sensing element whose resistance varies with temperature. For example, a platinum resistive temperature detector consists of a platinum wire coil that is wound around a film of platinum deposited on a substrate. A thermocouple, on the other hand, consists of a two-wire junction made of two different metals. Finally, a silicon sensor is an integrated circuit that typically includes extensive signal processing circuitry within a package housing the sensor.

With the increasing usage of sensors, a growing number of consumer and commercial products requires a combination of temperature and magnetic sensors. Unfortunately, because of the size, cost and other constraints, a compromise often has to be made among the several desired sensors included in a product. Thus, there is an apparent need for low-cost, multi-purpose sensors.

SUMMARY

The system and methods are illustrated for an integrated dual-purpose sensing device.

One embodiment of an integrated dual purpose sensing device includes at least a first magnetoresistive element and a second magnetoresistive element, where each magnetoresistive element has a first sensing terminal and a second sensing terminal. According to an exemplary embodiment, the second sensing terminal associated with the first magnetoresistive element is connected to a first sensing terminal associated with the second magnetoresistive element. The first sensing terminal associated with the first sensing element is further connected to a power source. According to an exemplary embodiment, the integrated dual purpose sensing device is adaptable to provide two output measurements that are used to determine a temperature sensor reading and a magnetic sensor reading.

These as well as other aspects and advantages of the present invention will become apparent to those of ordinary skill of art by reading the following detailed description, with reference where appropriate to the accompanying drawings.

BRIEF DESCRIPTION OF THE DRAWINGS

An exemplary embodiment of the present invention is described below with reference to the drawings, in which.

DETAILED DESCRIPTION OF EXEMPLARY EMBODIMENTS

Figure 1:
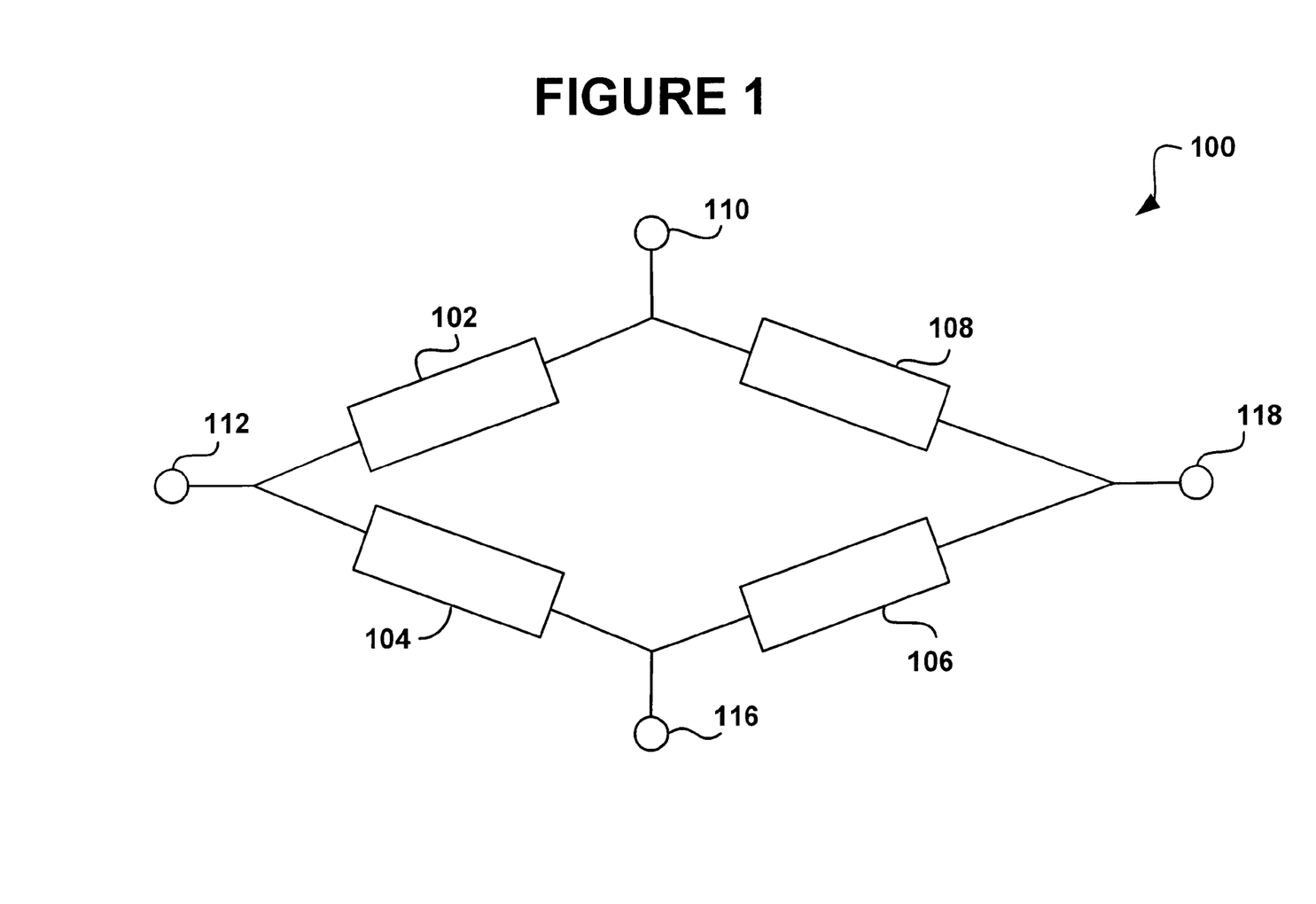
FIG. 1 is an electrical schematic diagram illustrating a sensor in a Wheatstone configuration in accordance with an embodiment of the present invention.

FIG. 1 is an electrical schematic diagram illustrating a sensor 100 that may be used in accordance with one embodiment of the present invention. The sensor 100 includes four magnetoresistive elements 102, 104, 106, and 108 arranged in a Wheatstone bridge configuration. As illustrated in FIG. 1, the magnetoresistive elements are divided by sensing terminals 110, 112, 116, and 118. With a bridge power supply, such as a voltage supply, applied between the sensing terminals 110 and 116, the output of the bridge may be measured between terminals 112 and 118. In one embodiment, the sensor consists of four magnetoresistive elements having the same resistance R, and the bridge supply voltage causes a current to flow through the magnetoresistive elements. The presence of an applied magnetic field causes the magnetization in two of the oppositely placed magnetoresistive elements to rotate towards the current, resulting in an increase in the resistance R. For example, the resistance in the magnetoresistive elements 104 and 108 may increase to R+ΔR. In such an embodiment, magnetization in the remaining oppositely-placed magnetoresistive elements 102 and 106 rotates away from the current and results in a decrease of the resistance in elements 102 and 106 by ΔR.

Figure 2:
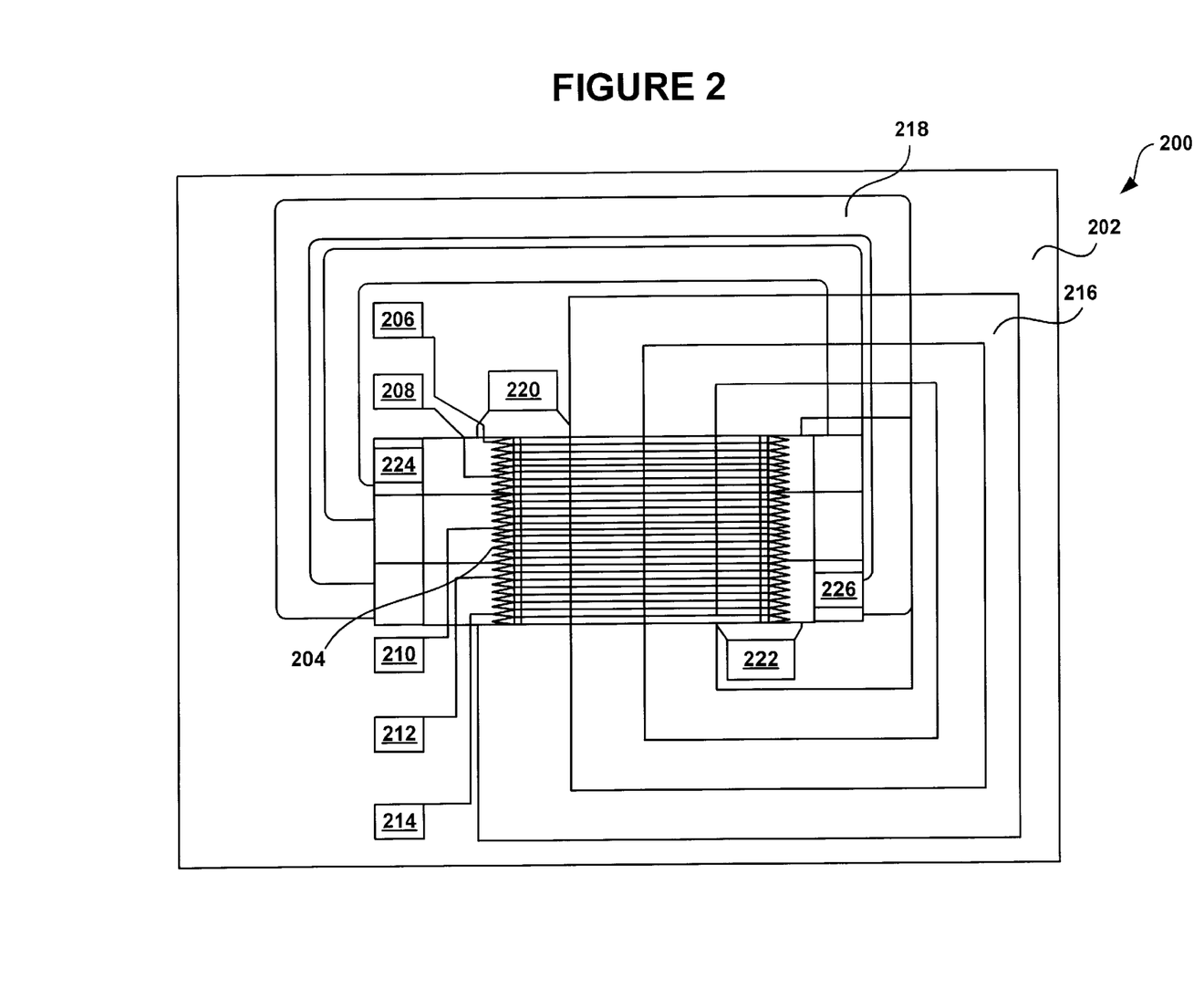
FIG. 2 is an integrated circuit layout for the sensor illustrated in FIG. 1.

FIG. 2 illustrates a layout for an integrated circuit 200 that may be employed as a Wheatstone bridge sensor according to one exemplary embodiment. The integrated circuit 200 includes a substrate 202, a sensing structure 204, and sensing terminals 206, 208, 210, 212, and 214. The sensing structure 204 may be configured as a resistance bridge such as the Wheatstone bridge 100 illustrated in FIG. 1. FIG. 2 also illustrates a set-reset strap 216 and an offset strap 218. Also illustrated are set-reset terminals 220 and 222, and offset terminals 224, 226. When a current of sufficient magnitude is run between the set-reset terminals 220 and 222 and through the set-reset strap 216, the magnetic flux generated around the set-reset strap 216 may reset the sensing structure 204 into a single magnetic domain. By orienting the sensing structure's magnetic domain in a preferred axis, a baseline state is established that allows for a high sensitivity and repeatable output characteristics. The set-reset strap 216 illustrated in FIG. 2 is arranged in a "spiral" pattern. However, other arrangements may also be used, such as a "serpentine," an "S" shape, a "V" shape, a zigzag shape, a combination of these, or a shape in which the strap or pieces of the strap are curved or angled.

When a current is run from the offset terminal 224 to the offset terminal 226, one may bias the sensing structure 204 to compensate for background magnetic fields. To do that, the current in the offset strap 218 may generate a magnetic flux that is perpendicular to the long axis of the sensing structure 204. When a current is run through the offset strap 218 in a consistent direction, the sensing structure's elements may be biased in the same direction. The offset strap 218 may be also configured to bias different elements of the sensing structure 204 in different directions. Several additional uses of the offset strap 218 are discussed in the U.S. Pat. No. 5,247,278 to Pant.

According to an exemplary, a sensing device, such as a sensing device having a Wheatstone bridge configuration or a sensing device having a half-Wheatstone bridge configuration, provides multiple outputs including a first output and a second output that are employed to determine a temperature sensor reading and a magnetic field sensor reading, the embodiments of which will be described below.

Figure 3:
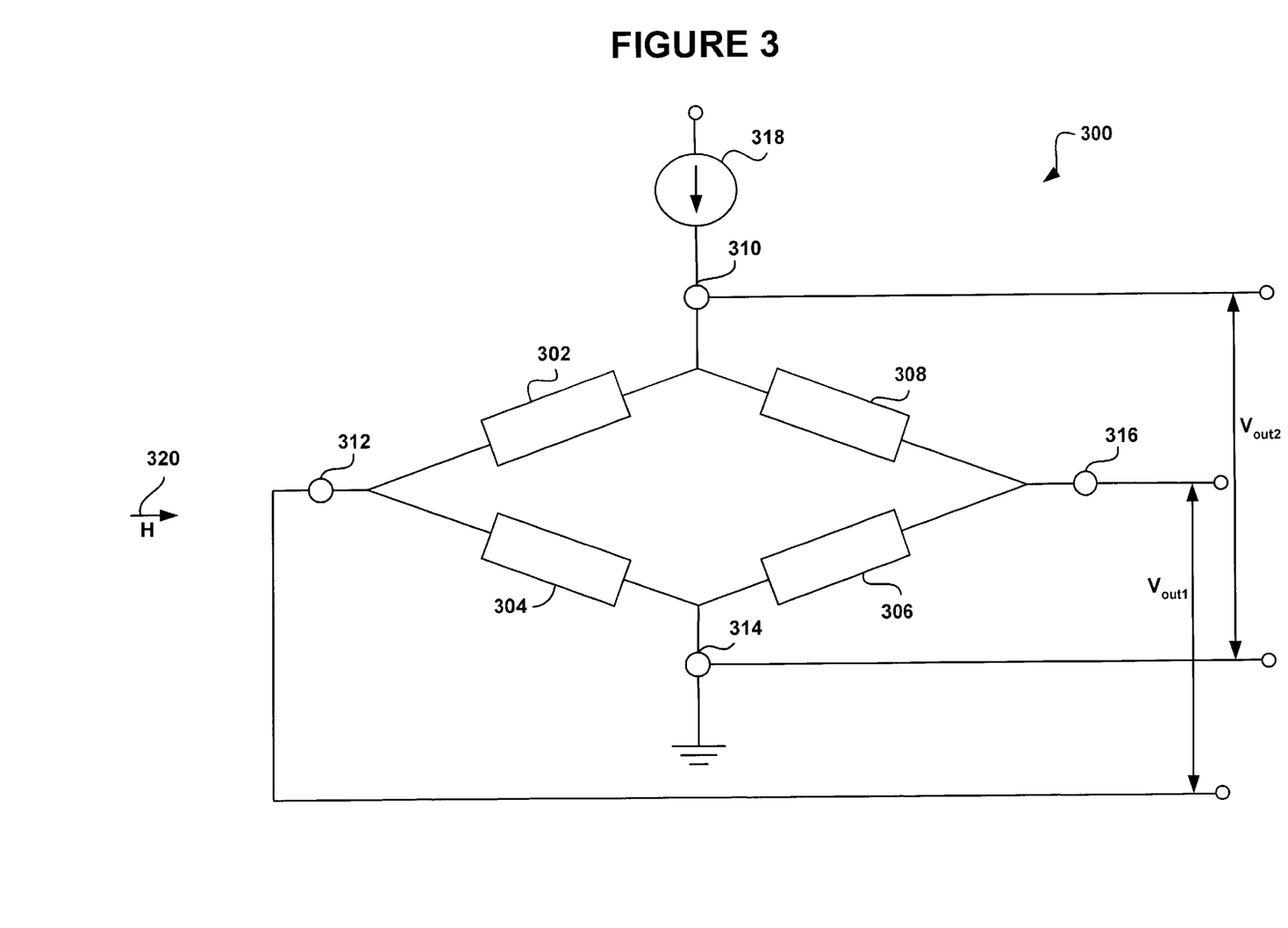
FIG. 3 is an electrical schematic diagram illustrating a multi-purpose sensor implemented in a full Wheatstone bridge configuration in accordance with one exemplary embodiment of the present invention.

FIG. 3 is an electrical schematic diagram illustrating a multi-purpose sensor 300 in accordance with one exemplary embodiment. Similarly to the schematic illustrated in FIG. 1, the diagram shows the dual-purpose sensor 300 arranged in a full Wheatstone bridge configuration having four magnetoresistive elements 302, 304, 306, and 308. According to an exemplary embodiment, the resistance in the magnetoresistive elements 304 and 308, in the presence of an applied magnetic field, may increase to R+ΔR, and the resistance in the magnetoresistive elements 302 and 306 may decrease to R−ΔR. Each magnetoresistive element includes a first sensing terminal and a second sensing terminal. It should be understood that giant magnetoresistive elements could also be used in exemplary embodiments, and the exemplary embodiments are not limited to magnetoresistive elements. Further, according to an exemplary embodiment illustrated in FIG. 3, the dual-purpose sensor 300 includes four sensing terminals 310, 312, 314, and 316. The sensing terminals 310, 312, 314 and 316 are formed by connecting a second sensing terminal associated with the element 302 to a first sensing terminal associated with the element 304, connecting a second sensing terminal associated with the element 304 to a first sensing terminal associated with the element 306, connecting a second sensing terminal associated with the element 306 to a first sensing terminal associated with the element 308, and, further, connecting a second sensing terminal associated with the element 308 to a first sensing terminal associated with the element 302.

As illustrated in FIG. 3, the sensing terminal 310 is connected to a power source 318. Specifically, the power source 318 includes a current source that supplies a constant direct current to the sensor 300. It should be understood that the power source 318 illustrated in FIG. 3, and any power sources illustrated in subsequent figures may be internal power sources integrated into the sensor or external power sources. According to an exemplary embodiment, the sensor 300 provides two output measurements that are employed to determine multi-purpose sensor readings. Specifically, the multi-purpose sensor readings include a magnetic sensor reading and a temperature sensor reading.

In the embodiment illustrated in FIG. 3, a first voltage measurement ("Vout1") is taken across the sensing terminals 316 and 312. The Vout1 provides a magnetic sensor reading. Assuming "I" is a constant current supplied by the current Source 318, "ΔR" is a magnetoresistance, "S" is a bridge sensitivity related to magnetoresistive ratio, and "H" is an external magnetic field applied in a direction 320 illustrated in FIG. 3, the first output voltage may be computed according to the following equation:

$$\text{Vout1} = I \times \Delta R = I \times R \times S \times H, \text{ or} \qquad \text{Eq. 1}$$

$$\text{Vout1} = \text{Vout2} \times S \times H \qquad \text{Eq. 2}$$

According to an exemplary embodiment, the Vout1 value is used to determine the magnetic field. Specifically, employing the equations for Vout1, a magnetic field may be calculated according to Eq. 3 or Eq. 4:

$$H = \text{Vout1}/(I \times R \times S) \qquad \text{Eq. 3}$$

$$H = \text{Vout1}/(\text{Vout2} \cdot S) \qquad \text{Eq. 4}$$

Referring back to FIG. 3, a second voltage measurement ("Vout2") is taken across the sensing terminals 310 and 314, and the Vout2 value is employed to determine a temperature sensor reading. According to an exemplary embodiment, magnetoresistive or giant magnetoresistive materials that are employed for dual-purpose sensors have relatively large and substantially linear temperature coefficients. Thus, a temperature sensor reading may be determined by measuring the value of the resistance. Similarly to the magnetic sensor computations, assuming that "I" is the constant current supplied by the current source 318, "Ro" is a bridge resistance at zero temperature, "C" is a constant, and "T" is a temperature measured by a temperature sensor, the Vout2 may be computed using the following equation:

$$\text{Vout2} = I \times R = I \times Ro \times (1 + C \times T) = I \times Ro + I \times Ro \times C \times T \qquad \text{Eq. 5}$$

Similarly to the magnetic field conversions illustrated in reference to Eq. 1 and Eq. 2 for Vout1, Eq. 5 for Vout2 may be employed to determine a temperature sensor reading. Specifically, using Eq. 5, a temperature sensor reading may be calculated as follows:

$$T = (\text{Vout2} - I \times Ro)/(I \times Ro \times C) \qquad \text{Eq. 6}$$

In one embodiment, the sensing functionality of the bridge may be controlled by a logical sensing element operable to determine a magnetic field sensor reading and a temperature sensor reading based on the two voltage outputs taken at the sensing terminals 310, 314 and at 312, 316. In one embodiment, two output channels may be fed into parallel-signal circuitry and, further, to a microprocessor via two converters. The microprocessor may then be operable to determine the magnetic field and temperature sensor reading using the equations described above. Further, the microprocessor may employ a look-up table or a polynomial that may be used to calculate both the magnetic field and temperature based on the transfer function calibration. In an alternative embodiment, two outputs from the sensor can be input to a MUX and further to the microprocessor via an analog to digital (A/D) converter. However, it should be understood that different embodiments are possible as well, and the sensing element may be implemented using hardware, software, firmware elements, or a combination thereof.

Figure 4:
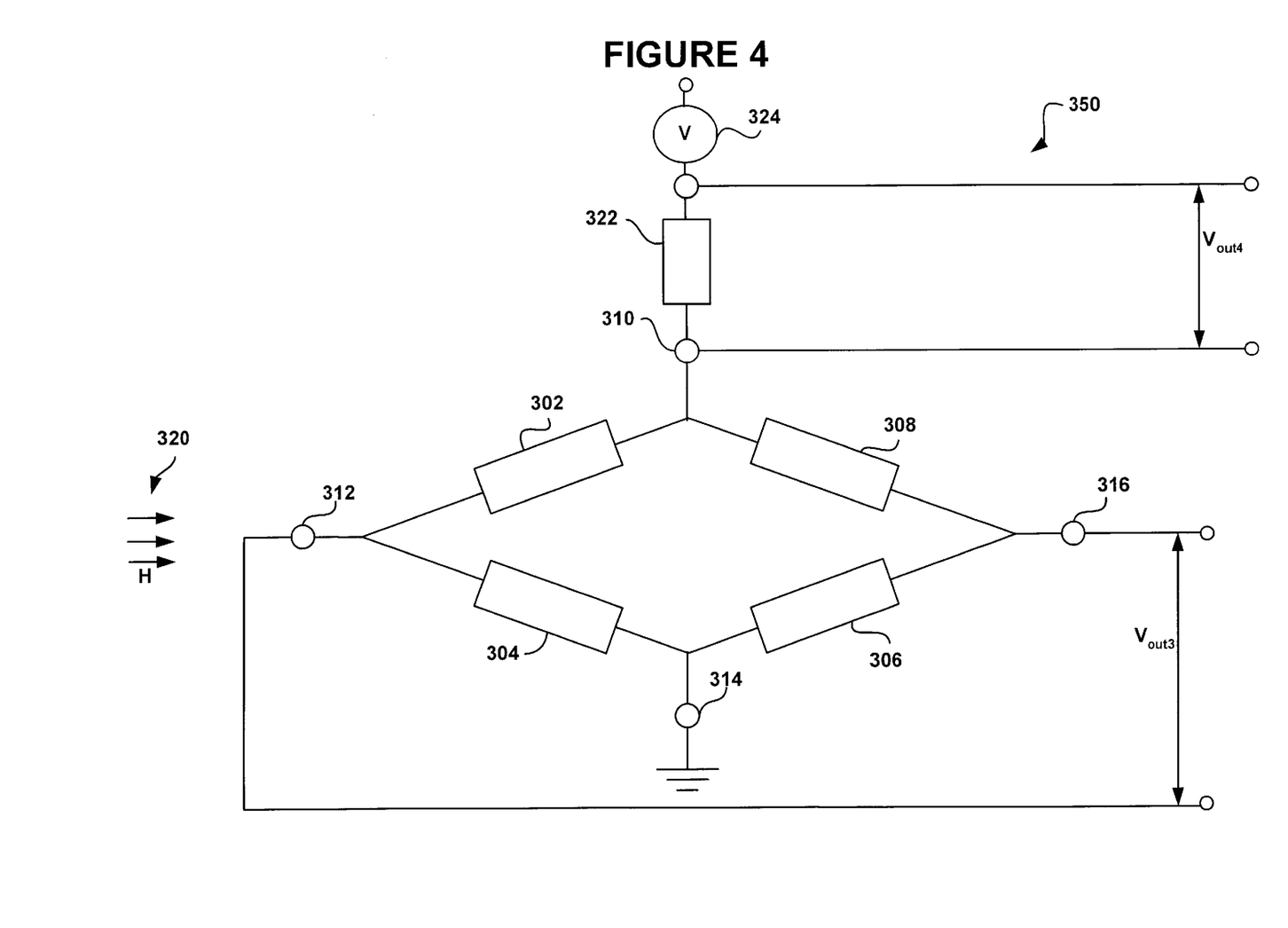
FIG. 4 is an electrical schematic diagram illustrating a multi-purpose sensor implemented in a full Wheatstone bridge configuration in accordance with another exemplary embodiment of the present invention.

FIG. 4 is an electrical schematic diagram illustrating a multi-purpose sensor 350 in accordance with an alternative embodiment. Similarly to the schematic illustrated in FIG. 3, the diagram illustrates a full Wheatstone bridge configuration including four magnetoresistive elements 302, 304, 306, 308 divided by the sensing terminals 310, 312, 314, and 316. According to the alternative embodiment for a multi-purpose sensor, a power supply of the bridge includes a voltage source 324 connected to one of the sensing terminals via a resistive element 322. As mentioned in reference to FIG. 3, power sources may be external or internal. Thus, the voltage source may be incorporated into the sensor, or may be external to the sensor. The resistive element 322, and any resistive elements described in reference to next figures, may include one or more resistor having a very low temperature coefficient, or being insensitive to temperature. It should be understood that the present invention is not limited to using resistors, and those skilled in the art will appreciate that different components could also be used. Further, resistive elements described herein may be internal resistive elements (incorporated into a sensing device) or external resistive elements (externally connected to a sensing device).

Similarly to the embodiment illustrated in FIG. 3, the sensor 350 provides two output measurements Vout3 and Vout4. The first voltage measurement (Vout3) is taken across the sensing terminal 316 and 312 and provides a magnetic sensor reading. Assuming "R" is a resistance of magnetoresistive elements, "ΔR" is a change in magnetoresistance, "S" is a bridge sensitivity related to the magnetoresistive ratio. "H" is an external magnetic field, and "r" is the resistance of the resistive element 322, and "V" is the voltage of the constant voltage source 324, the first output voltage may be computed according to the following equation:

$$\text{Vout3} = \text{Vout4} \times \Delta R/r = \text{Vout4} \times R \times S \times H/r, \text{ or} \qquad \text{Eq. 7}$$

$$\text{Vout3} = (V - \text{Vout4}) \times S \times H \qquad \text{Eq. 8}$$

Employing the equation for Vout3, a magnetic field may be computed according to the following equation:

$$H = \text{Vout3}/[(V - \text{Vout4})S \times \qquad \text{Eq. 9}$$

Referring back to FIG. 4, the second voltage measurement Vout4 is employed to determine a temperature sensor's reading. Assuming that "Ro" is a bridge resistance at zero temperature, "C" is a constant, and "T" is a temperature sensor's reading, the Vout4 may be computed using the following equation:

$$V - \text{Vout4} = \text{Vout4} \times R/r \text{ where } V - \text{Vout4} = \text{Vout4} \times Ro \times (1 + C \times T)/r \qquad \text{Eq. 10}$$

Eq. 10 may be employed to determine a temperature sensor's reading. Referring back to Eq. 7 and Eq. 8, the embodiment of a multi-purpose sensor illustrated in FIG. 4 is more complicated than the embodiment illustrated in FIG. 3 since in the multi-purpose sensor embodiment illustrated in FIG. 4 both measurements of Vout3 and Vout4 are required to determine an external magnetic field. Thus, the embodiment illustrated in FIG. 4 may introduce more error. As described in reference to FIG. 4, the logical sensing element may be employed to determine the temperature and magnetic field. Further, as described in reference to FIG. 4, for higher accuracy, a look-up table or a polynomial can be employed to calculate both the magnetic field and temperature based on the transfer function calibration associated with the sensor.

It should be understood that dual-purpose sensors according to exemplary embodiments are not limited to a full Wheatstone bridge configuration and magnetic sensors including only two magnetoresistive elements, or a half Wheatstone bridge configuration, may be also employed to operate as multi-purpose sensors according to exemplary embodiments.

Figure 5:
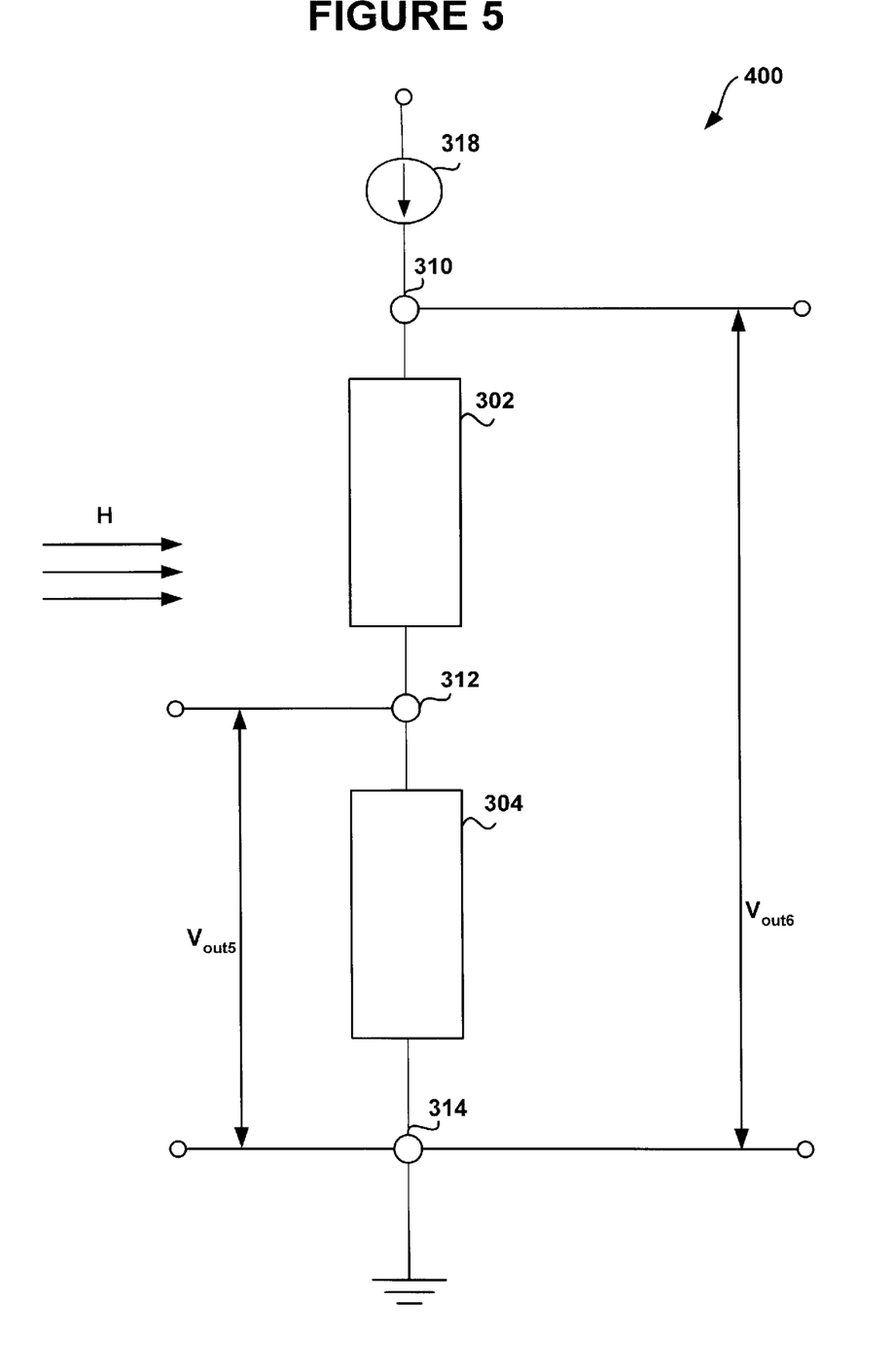
FIG. 5 is an electrical schematic diagram illustrating a multi-purpose sensor implemented in a half Wheatstone bridge configuration in accordance with one exemplary embodiment of the present invention.

FIG. 5 is an electrical schematic diagram illustrating a dual-purpose sensor 400 including two magnetoresistive elements 302, 304 arranged in a half Wheatstone bridge configuration and having the sensing terminal 310 connected to the current source 318 and the sensing terminal 314 connected to the ground. In the embodiment illustrated in FIG. 5, a first voltage measurement (Vout5) is taken across the sensing terminals 312 and 314, and provides a magnetic field sensor reading. Making the same assumption as in the preceding equations, the output voltage Vout5 may be computed using the following equation:

$$Vout5 = I \times (R + \Delta R), \text{ or} \qquad \text{Eq. 11}$$

$$Vout5 = Vout6/2 \times (1 + S \times H) \qquad \text{Eq. 12}$$

Referring back to FIG. 5, a second voltage measurement (Vout6) is taken across the sensing terminals 310 and 314. According to an exemplary embodiment, the Vout6 value is employed to determine a temperature sensor reading. Making similar assumptions as in the preceding equations, Vout6 may be computed using the following equation:

$$Vout6 = I \times 2R = I \times 2Ro \times (1 + C \times T) = 2I \times Ro + 2I \times Ro \times C \times T \qquad \text{Eq. 13}$$

Using a logical sensing element as described in reference to FIG. 3, a temperature sensor reading may be computed using Eq. 13, and a magnetic sensor reading may be computed using Eq. 11 and Eq. 12.

Figure 6:
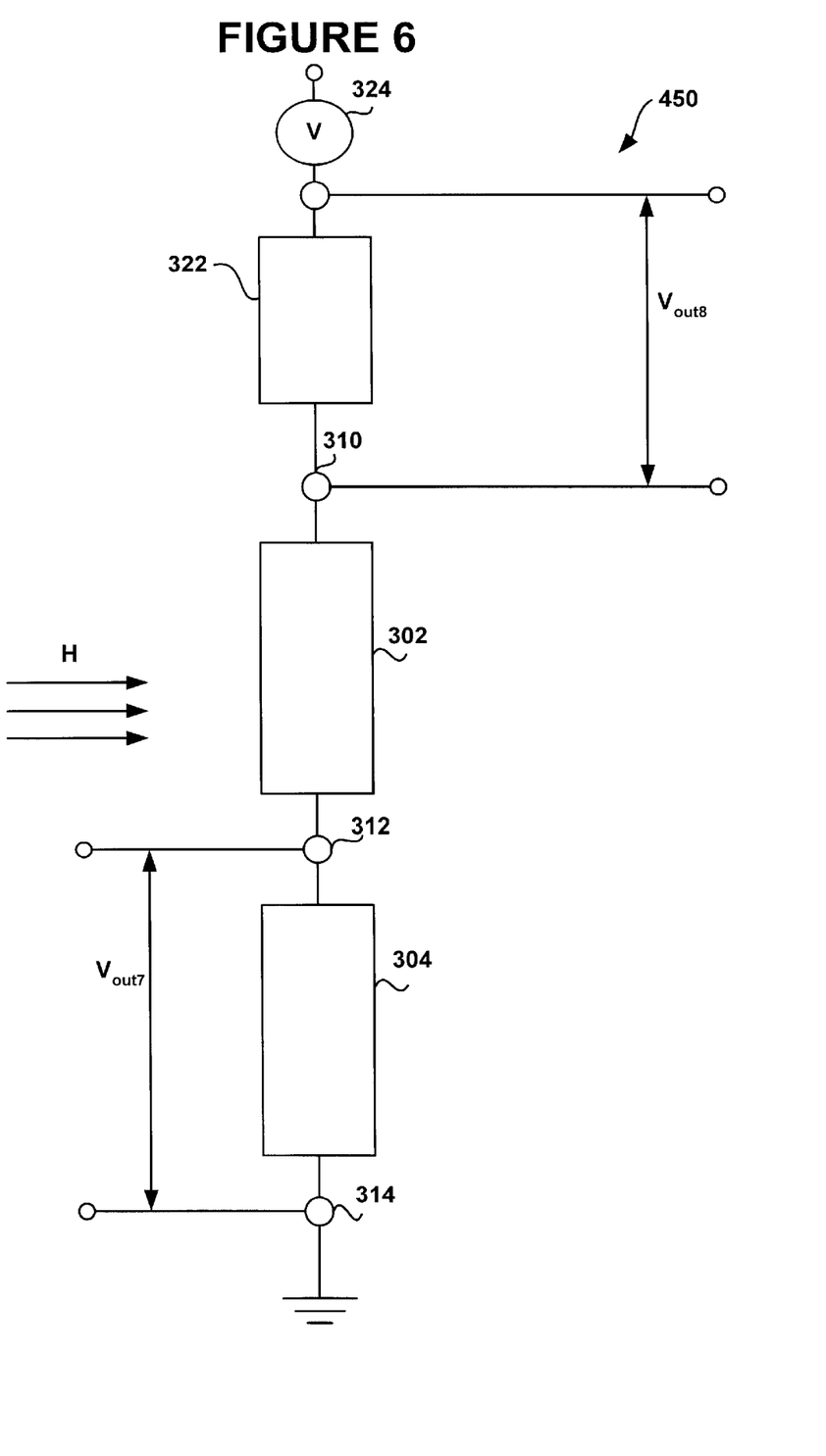
FIG. 6 is an electrical schematic diagram illustrating a multi-purpose sensor implemented in a half Wheatstone bridge configuration in accordance with another exemplary embodiment of the present invention.

FIG. 6 is an electrical schematic diagram 450 of a half Wheatstone bridge configuration that may be employed as a dual-purpose sensor according to an alternative embodiment. The half Wheatstone bridge configuration includes two magnetoresistive elements 302 and 304 divided by the sensing terminals 310, 312, and 314. According to the alternative embodiment of the half Wheatstone bridge configuration, the voltage source 324 is connected to the sensing terminal 310 via the resistive element 322 including, for example, a resistor having a very low temperature coefficient or being insensitive to temperature. Similarly to the preceding figures, two voltage measurements are taken to determine a magnetic field sensor reading and a temperature sensor reading. The first voltage measurement (Vout7) is employed to determine a magnetic field sensor reading, and the second voltage measurement (Vout8) is employed to determine a temperature sensor reading. Referring to FIG. 6. the Vout7 measurement is taken across the sensing terminals 312 and 314.

Assuming that "V" is a constant voltage supplied by the voltage source 324, and "r" is the resistance of the resistive element 322, Vout7 may be computed using the following equation:

$$Vout7 = Vout8 \times (R + \Delta R)/r = Vout8 \times R \times (1 + S \times H)/r = (V - Vout8) \times (1 + S \times H)/2 \qquad \text{Eq. 14}$$

Referring back to FIG. 6, the Vout8 measurement is taken across the resistive element 322 and may be computed using the following equation:

$$V - Vout8 = Vout8 \times 2R/r = Vout8 \times 2Ro \times (1 + C \times T)/r \qquad \text{Eq. 15}$$

A temperature (T) reading may be determined using Eq. 15, and a magnetic field sensor reading may be determined using Eq. 14. Similarly to the embodiments for dual-purpose sensors employing a full Wheatstone bridge configuration, a logical element, as discussed in reference to FIGS. 5 and 6, may use the two output measurements to determine a magnetic sensor reading and a temperature sensor reading.

As mentioned in reference to the preceding Figures, the logical element may be implemented using a processor, and/or hardware, software, firmware elements, or a combination thereof.

Further, according to an exemplary embodiment, a sensor may include metal structures (metal straps), or current straps, known as set-reset and offset straps, for restoring sensor's characteristics. As mentioned earlier, the use of current straps in a magnetic field sensing device is discussed in the U.S. Pat. No. 5,247,278 to Bharat B. Pant, assigned to the same assignee as the current application, and fully incorporated herein by reference. The offset and set/reset straps are deposited as two metal layers in the same area occupied by the sensor bridge element. These metal layers are often electrically isolated from one another by insulation layers.

Figure 7:
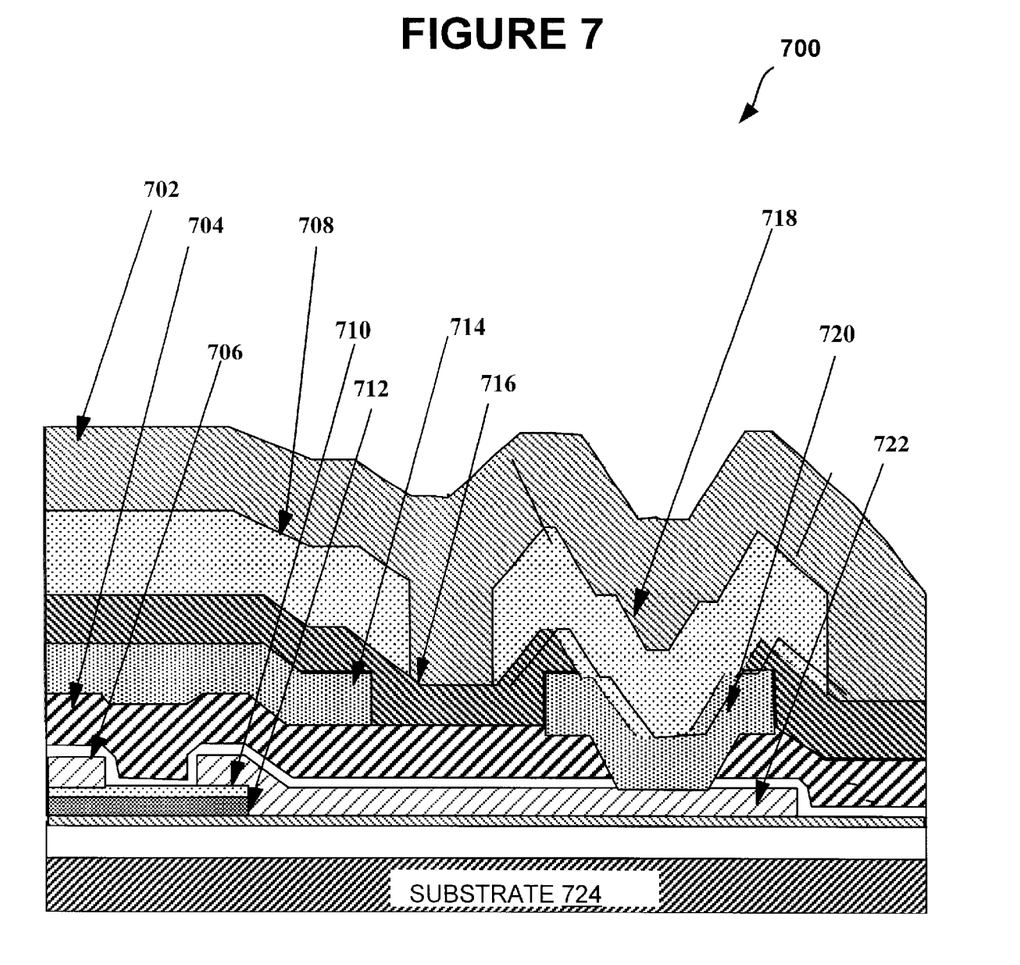
FIG. 7 is a block diagram illustrating an exemplary cross-section for a layer arrangement in a sensor according to one exemplary embodiment of the present invention.

FIG. 7 is a block diagram illustrating an exemplary cross-section 700 of the layer arrangement in a sensor. As shown in FIG. 7, a plurality of materials is deposited on a substrate 724. Depositing, cutting, etching, and other steps used in a photolitographic process are well known in the art. General methods for MR/GMR sensor fabrication are also described in U.S. Pat. No. 5,820,924 to Witcraft et al., and assigned to the same assignee as the present application. U.S. Pat. No. 5,820,924 is fully incorporated herein by reference. Starting from the substrate, the sensor includes a permalloy layer 712 composed of nickel and iron, for instance. Further, the sensor includes an insulator layer 710, and electrical conductors in the form of pads 718, 720 and 722 that may include output terminal leads. The sensor 700 further includes an offset strap 714 placed between two dielectric layers 704 and 716. The sensor further includes a Barber Pole/interconnect bar 704 arranged to provide barber pole biasing. For instance, the barber pole biasing may cause the current to flow at 45-degree angle in the film. The sensor may further include a set/reset strap 708, and a passivation nitride layer 702. It should be understood that FIG. 7 illustrates only an exemplary embodiment, and it should be understood that different embodiments are possible as well.

Figure 8:
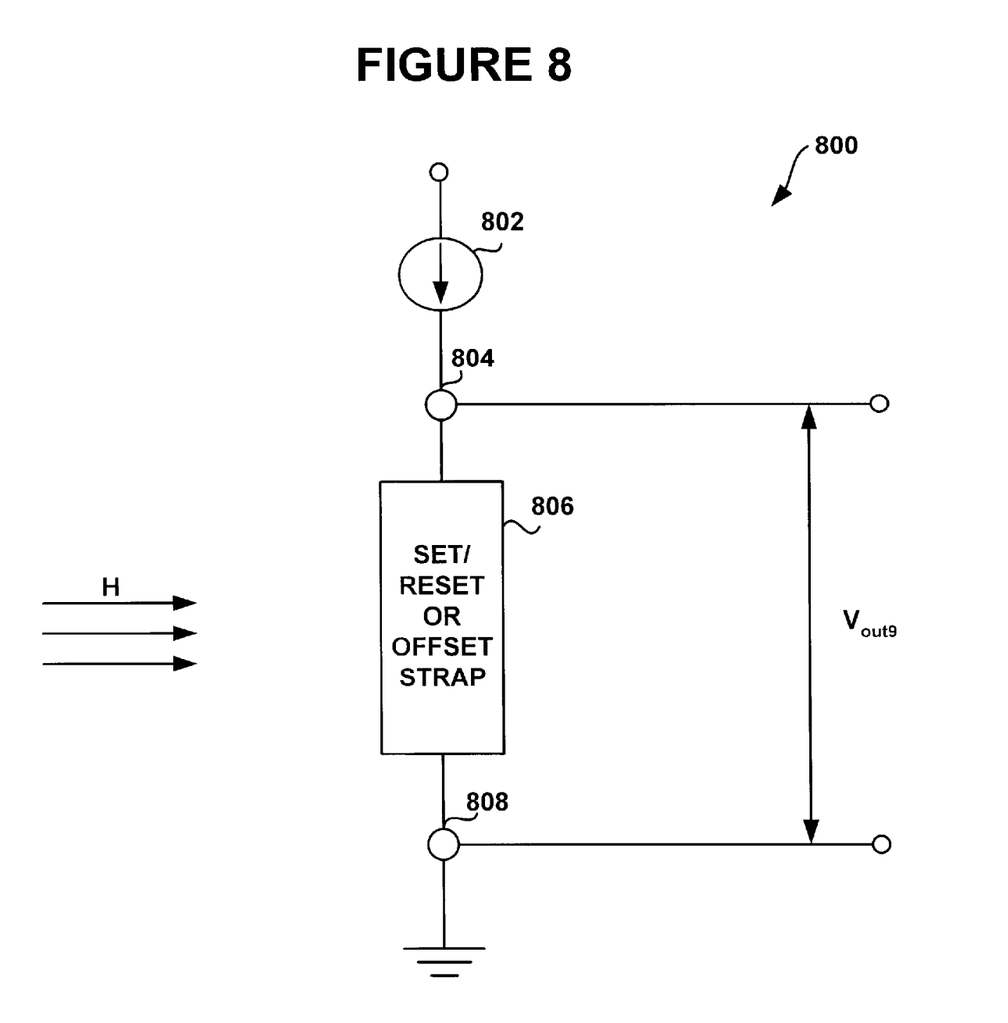
FIG. 8 is an electrical schematic diagram illustrating a current strap configuration providing a temperature sensor reading according to one exemplary embodiment of the present invention.

According to an exemplary embodiment, in addition to restoring sensor's characteristics, metal straps deposited on an MR/GMR sensor, such as the set/reset or offset straps, may be utilized for provide a temperature sensor reading. FIG. 8 is an electrical schematic diagram of a metal (or current) strap configuration 800 that may be employed to provide a temperature sensor reading according to one exemplary embodiment employing a constant current source. As illustrated in FIG. 8, a current strap 806, such as a set/reset strap or an offset strap, is connected to two sensing terminals 804 and 808, with the sensing terminal 804 connected to a constant current source 802 and the sensing terminal 808 connected to the ground. According to an exemplary embodiment, a voltage measurement "Vout9" for a temperature sensor reading is taken across the current strap 806. Assuming that "Rstrap" is a strap's resistance, "I" is the constant current provided by the current source 802, and the other symbols as defined above, the output voltage Vout9 may be computed according to the following equation:

$$Vout9 = I \times Rstrap = I \times Ro \times (1 + C \times T) \qquad \text{Eq. 16}$$

Eq. 16 may be used to determine the temperature sensor's reading, and the magnetic sensor reading may be determined using the methods described above.

According to an exemplary embodiment, magnetoresistive elements included in multi-purpose sensors described in reference to the preceding figures may include anisotropic magnetoresistive elements or giant magnetoresistive elements, for instance. Further, those skilled in the art will appreciate that different embodiments are possible as well.

Figure 9:
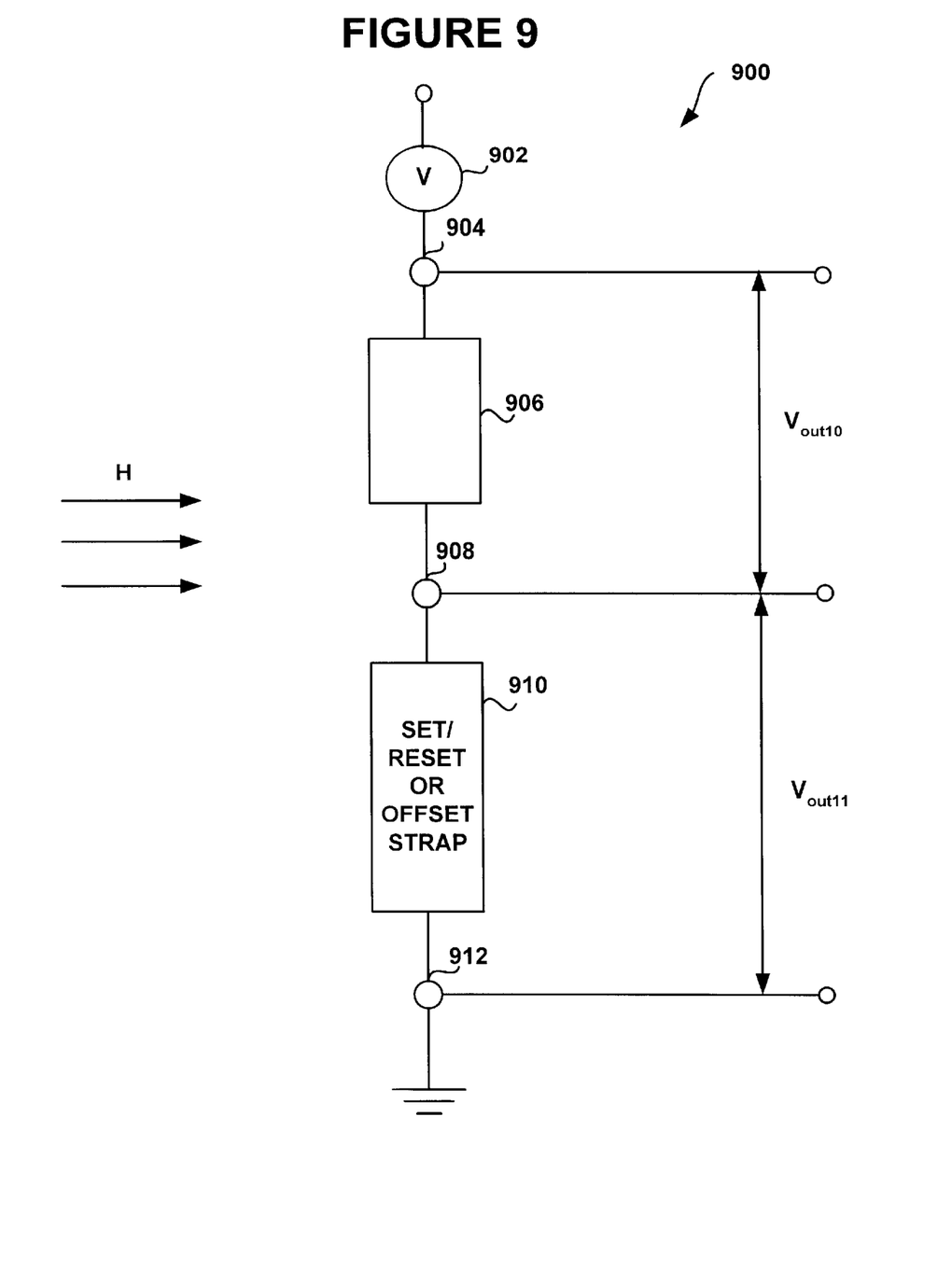
FIG. 9 is an electrical schematic diagram illustrating a current strap configuration providing a temperature sensor reading according to another exemplary embodiment of the present invention.

FIG. 9 is an electrical schematic diagram of a current strap configuration 900 that may be employed to provide a temperature sensor reading according to one exemplary embodiment employing a constant voltage source.

As illustrated in FIG. 9, a current strap 910, such as a set/reset strap or an offset strap, is connected to two sensing terminals 908 and 912, with the sensing terminal 912 connected to the ground. Further, the sensing terminal 908 is connected to a constant voltage source 902 via a resistive element 906 and a sensing terminal 904. Similarly to the preceding figures describing sensor embodiments employing a constant current source, the resistive element 906 may include a resistor having a very low temperature coefficient or being insensitive to temperature.

According to an exemplary embodiment illustrated in FIG. 9, two voltage measurements "Vout10" and "Vout11" may be taken to determine a temperature sensor reading, where Vout10 is taken across the resistive element 906, and Vout11 is taken across the current strap 910. Assuming that "r" is the resistance of the resistive element 906, and other symbols as defined above, Vout10 and Vout11 may be computed using the following equations:

$$\text{Vout10} = I \times r \qquad \text{Eq. 17}$$

$$\text{Vout11} = I \times \text{Rstrap} = I \times Ro \times (1 + C \times T) = \text{Vout10} \times Ro \times (1 + C \times T)/r \qquad \text{Eq. 18}$$

Eq. 18 may be used to determine the temperature sensor's reading, and the magnetic sensor reading may be determined using the methods described above.

Accordingly, the proposed embodiments for the dual-purpose sensors do not require any additional hardware and provide a cost and space-effective approach.

Magnetic sensors enable and enhance a wide variety of applications, including compassing, navigation, GPS and other systems. Therefore, magnetic sensors are becoming an important part of large systems or products comprised of various other sensors such as tilt, accelerometer, gyro, angular rate, or pressure sensors. Most likely these sensors exhibit temperature sensitivity, and a measure of the system operating temperature is often required to temperature compensate (or correct) for the quantity measured. The range of the operating temperature is narrow, and the temperature change, rather than the absolute temperature, is often sufficient to implement the compensation/correction. In such an embodiment, the constant current implementation of the dual-purpose sensor leads to a simplified form. For example, differentiating both sides of Eq. 5 and Eq. 13 with respect to temperature (T) leads the following equations:

$$d\text{Vout2} = I \times Ro \times C \times dT \qquad \text{Eq. 19}$$

and $$d\text{Vout6} = 2 \times I \times Ro \times C \times dT, \qquad \text{Eq. 20}$$

where dVout2, dVout6, and dT denote the respective changes. Therefore, the change in temperature is directly proportional to the change in Vout, and the latter may be used for temperature compensation.

It should be understood that the above-described arrangements are simply illustrative of the application of principles of the present invention, and numerous arrangements may be readily devised by those skilled in the art. The embodiments for dual-purpose sensors have been described using Wheatstone bridge sensor configurations. However, it should be understood that the present invention is not limited to the Wheatstone bridges, and different sensing device configurations could also be used. Further, it should be understood that the illustrated dual-purpose sensor configurations could be single-chip configuration or multi-chip configurations.

The claims should not be read as limited to the described order or elements unless stated to that effect. Therefore, all embodiments that come within the scope and spirit of the following claims and equivalents thereto are claimed as the invention.

What is claimed:

1. A sensing device, comprising in combination:
   a first magnetoresistive element;
   a second magnetoresistive element electrically coupled in series with the first magnetoresistive element;
   a first output taken across the second magnetoresistive element providing a signal proportional to a magnetic field;
   a second output taken across the first and second magnetoresistive elements providing a signal proportional to temperature; and
   a logical sensing element operable to convert the first and second outputs into magnetic field and temperature readings using magnetoresistive characteristics of the first and second magnetoresistive elements.

2. The sensing device of claim 1, wherein the magnetoresistive characteristics include bridge sensitivity and bridge resistance at zero degrees.

3. The sensing device of claim 1, wherein the magnetoresistive elements are selected from a group consisting of (i) an anisotropic magnetoresistive element, and (ii) a giant magnetoresistive element.

4. The sensing device of claim 1, wherein the first magnetoresistive element is connected to a power source.

5. The sensing device of claim 4, wherein the power source is selected from a group consisting of (i) a power source comprised in the sensing device, and (ii) a power source external to the sensing device.

6. The sensing device of claim 4, wherein the power source comprises a constant current source connected to the first magnetoresistive element.

* * * * *

UNITED STATES PATENT AND TRADEMARK OFFICE
CERTIFICATE OF CORRECTION

PATENT NO.     : 6,667,682 B2
DATED          : December 23, 2003
INVENTOR(S)    : Hong Wan and Lakshman S. Withanawasam It is certified that error appears in the above-identified patent and that said Letters Patent is hereby corrected as shown below:

Column 5,
Line 3, please replace "Source 318" with -- source 318 --.

Column 6,
Line 36, Eq. 9, please replace "H=Vout3/[(V-Vout4)Sx" with -- H=Vout3/[(V-Vout4)xS] --.

Signed and Sealed this

Twenty-seventh Day of July, 2004

JON W. DUDAS
*Acting Director of the United States Patent and Trademark Office*